(12) United States Patent
Hori

(10) Patent No.: US 8,411,722 B2
(45) Date of Patent: Apr. 2, 2013

(54) VERTICAL CAVITY SURFACE EMITTING LASER

(75) Inventor: Yuichiro Hori, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 695 days.

(21) Appl. No.: 11/678,441

(22) Filed: Feb. 23, 2007

(65) Prior Publication Data

US 2007/0201526 A1   Aug. 30, 2007

(30) Foreign Application Priority Data

Feb. 28, 2006   (JP) .................................. 2006-054114

(51) Int. Cl.
*H01S 3/081*  (2006.01)

(52) U.S. Cl. ................. 372/99; 372/50.124; 372/46.014

(58) Field of Classification Search ............. 372/50.124, 372/46.014, 99
See application file for complete search history.

(56) References Cited

U.S. PATENT DOCUMENTS

| | | | | |
|---|---|---|---|---|
| 6,107,196 A | * | 8/2000 | Rolfson ........................ | 438/668 |
| 6,683,898 B2 | * | 1/2004 | Østergaard et al. ......... | 372/43.01 |
| 6,803,605 B2 | * | 10/2004 | Lindstrom et al. .............. | 257/94 |
| 6,829,281 B2 | * | 12/2004 | Deng et al. ....................... | 372/96 |
| 2007/0201527 A1 | | 8/2007 | Hori et al. ................ | 372/50.124 |

FOREIGN PATENT DOCUMENTS

| JP | 2003-273455 | | 9/2003 |
|---|---|---|---|
| JP | 2003-273456 A | | 9/2003 |
| JP | 2003273455 A | * | 9/2003 |
| JP | 2006065150 A | * | 3/2006 |

OTHER PUBLICATIONS

V. Lousse, et al., "Angular and polarization properties of a photonic crystal slab mirror", Optics Express, vol. 12, No. 8, pp. 1575-1582 (Apr. 19, 2004).

* cited by examiner

*Primary Examiner* — Jessica Stultz
*Assistant Examiner* — Joshua King
(74) *Attorney, Agent, or Firm* — Fitzpatrick, Cella, Harper & Scinto

(57) ABSTRACT

A vertical cavity surface emitting laser includes a cavity formed by a pair of reflectors on a substrate and an active region interposed in the cavity. In the vertical cavity surface emitting laser, at least one of the reflectors that form the cavity has a refractive index periodic structure produced by arranging a first medium and a second medium so as to make the refractive index change periodically in in-plane directions of the substrate and the cross sectional area of the first medium in the in-plane directions changes in the direction of the thickness of the first medium. The vertical cavity surface emitting laser has reflectors having a wide reflection band.

7 Claims, 8 Drawing Sheets

VERTICAL CAVITY SURFACE EMITTING LASER

BACKGROUND OF THE INVENTION

1. Field of the Invention

The present invention relates to a vertical cavity surface emitting laser.

2. Description of the Related Art

Known surface emitting lasers include vertical cavity surface emitting lasers prepared by sandwiching an active region at opposite sides thereof between two reflectors and forming an optical cavity in the direction perpendicular to the substrate surface so as to emit a beam in the direction perpendicular to the substrate surface.

Research efforts have been intensively paid on vertical cavity surface emitting lasers since the late 1980s because those lasers provide a number of advantages as listed below.

This type of surface emitting laser shows a low threshold and a low power consumption rate and gives rises to a circular spot profile. Additionally, it can be coupled with an optical element with ease and arranged to form an array.

However, since this type of surface emitting laser has a small gain region, the pair of distributed Bragg reflectors (to be referred as DBRs hereinafter) that produce a cavity are required to show a reflectivity not lower than 99%.

In the case of semiconductor reflectors, they are required to be formed from a multilayer film having tens of layers in order to realize such reflectors. Then, because of this large thickness of the multilayer film, heat can be trapped in the cavity and the cavity tends to show a large threshold and/or a large electric resistance and hence current injection becomes difficult.

Several proposals have been made to date for cavity reflectors that can replace such DBRs).

For example, V. Lousse, et al., "Angular and polarization properties of a photonic crystal slab mirror", Optics Express, Vol. 12, No. 8, pp. 1575-1582 (Apr. 19, 2004) reports the wavelength dependency of reflected light and transmitted light when a two-dimensional slab photonic crystal is used as reflector.

A photonic crystal is a structure of a material that is artificially provided with refractive index modulation of about the wavelength of light. In other words, it is a structure where mediums having mutually different respective refractive indexes are disposed periodically. With a photonic crystal, it is believed that the propagation of light in crystal can be controlled due to the multiple scattering effect of light.

According to the above V. Lousse et al article, it is possible to have a two-dimensional slab photonic crystal reflect light substantially with an efficiency of 100% when the photonic crystal is formed by periodically arranging holes in a slab material showing a high refractive index.

It is reported that, when light is made to strike a so-called hole type two-dimensional slab photonic crystal in a direction substantially perpendicular to the crystal plane, light showing a predetermined frequency is reflected substantially with an efficiency of 100%.

A reflector that has been conventionally formed by a multilayer film with a thickness of several micrometers can now be formed by a very thin film having a thickness of tens to hundreds of several nanometers as a photonic crystal reflector to be used as reflector in a vertical cavity surface emitting laser.

Then, as a result, it is possible to significantly alleviate the problems of a thick reflector such as the difficulty of discharging heat and a high electric resistance.

SUMMARY OF THE INVENTION

However, the reflection band of photonic crystal reflector can be easily collapsed at an order of tens of several nanometers due to a preparation error. In such a case, the oscillation wavelength is shifted to outside of the high reflectivity band of the reflector. Then, the photonic crystal reflector may no longer operate as vertical cavity surface emitting laser reflector. To avoid this problem, it is necessary to prepare a reflector having a wide reflection band so that the reflectivity may not fall if the reflection characteristic of the reflector is shifted.

In view of the above-identified problem, it is therefore the object of the present invention to provide a vertical cavity surface emitting laser having a reflector of a wide reflection band.

According to the present invention, the above object is achieved by providing a vertical cavity surface emitting laser configured as follows.

In an aspect of the present invention, there is provided a vertical cavity surface emitting laser including a cavity formed by a pair of reflectors on a substrate and an active region interposed in the cavity; at least one of the reflectors forming the cavity having a refractive index periodic structure produced by arranging a first medium and a second medium so as to make the refractive index change periodically in in-plane directions of the substrate; the cross sectional area of the first medium in the in-plane directions changing in the direction of the thickness of the first medium.

Preferably, in a vertical cavity surface emitting laser according to the present invention, the cross sectional area of the first medium changes continuously or quasi-continuously in the direction of the thickness of the first medium.

Preferably, in a vertical cavity surface emitting laser according to the present invention, one of the mediums that form the refractive index periodic structure is holes.

Preferably, a vertical cavity surface emitting laser according to the present invention is formed by laying refractive index periodic structures having holes and the hole diameter of the holes of each of the layers changes continuously or quasi-continuously in the direction perpendicular to the surfaces of the reflectors.

Preferably, in a vertical cavity surface emitting laser according to the present invention, one of the mediums that form the refractive index periodic structure is a multilayer film made of films having mutually different compositions; and the refractive index of each of the layers of the multilayer film changes continuously or quasi-continuously in the direction perpendicular to the surfaces of the reflectors.

In another aspect of the present invention, there is provided a vertical cavity surface emitting laser including a multilayer film reflector, a first clad layer, an active layer, a second clad layer and a reflector in this order on a substrate; the reflector having a structure produced by arranging a first medium and a second medium so as to make the refractive index change periodically in in-plane directions of the substrate; the cross sectional area of the first medium in the in-plane directions gradually diminishing as the distance to the second clad layer is smaller.

Thus, according to the present invention, it is possible to realize a vertical cavity surface emitting laser having a reflector of a wide reflection band.

Further features of the present invention will become apparent from the following description of exemplary embodiments with reference to the attached drawings.

BRIEF DESCRIPTION OF THE DRAWINGS

FIG. 7A is a graph illustrating the reflection characteristic of the two-dimensional photonic crystal reflector obtained relative to a single band, and FIG. 7B is a graph illustrating the reflection characteristic of the two-dimensional photonic crystal reflector obtained relative to four bands.

FIG. 8A is a schematic cross sectional view taken along a direction perpendicular to the substrate of the vertical cavity surface emitting laser of Example 1, and FIG. 8B is a schematic plan view as viewed in the direction perpendicular to the surface of the cavity reflector of Example 1.

FIG. 11A is a schematic cross sectional view taken along a direction perpendicular to the photonic crystal surface, and FIG. 11B is a schematic plan view as viewed in the direction perpendicular to the photonic crystal surface.

FIG. 12A is a schematic cross sectional view taken along a direction perpendicular to the photonic crystal surface, and FIG. 12B is a schematic plan view as viewed in the direction perpendicular to the photonic crystal surface.

FIG. 13A is a schematic cross sectional view taken along a direction perpendicular to the photonic crystal surface, and FIG. 13B is a schematic plan view as viewed in the direction perpendicular to the photonic crystal surface.

DESCRIPTION OF THE EMBODIMENTS

Now, the present invention will be described by referring to the accompanying drawings that illustrate exemplary embodiments of the invention.

Photonic crystals that have been objects of technological researches in recent years can suitably be applied to refractive index periodic structures of the embodiments of the present invention.

Before getting into the embodiments of the present invention, photonic crystals will firstly be described.

Photonic crystals can be classified into one-dimensional crystals through three-dimensional crystals from the viewpoint of the direction in which the refractive index period is disposed.

Among photonic crystals, structures having the refractive index period disposed in the in-plane directions defined by two of the axes of a spatial coordinate system or in two directions that are orthogonal relative to each other in a spatial coordinate system are referred to as two-dimensional photonic crystals.

Two-dimensional photonic crystals do not show any periodic change in the refractive index in the remaining one direction. Generally, two-dimensional photonic crystals that are structures in which the refractive index periodically changes in in-plane directions have hitherto been objects of technological researches because such crystals are prepared relatively easily.

Of two-dimensional photonic crystals, those having a refractive index periodic structure formed from a thin plate-shaped material to show periodicity in in-plane directions are specifically referred to as two-dimensional slab photonic crystals.

Figure 1:
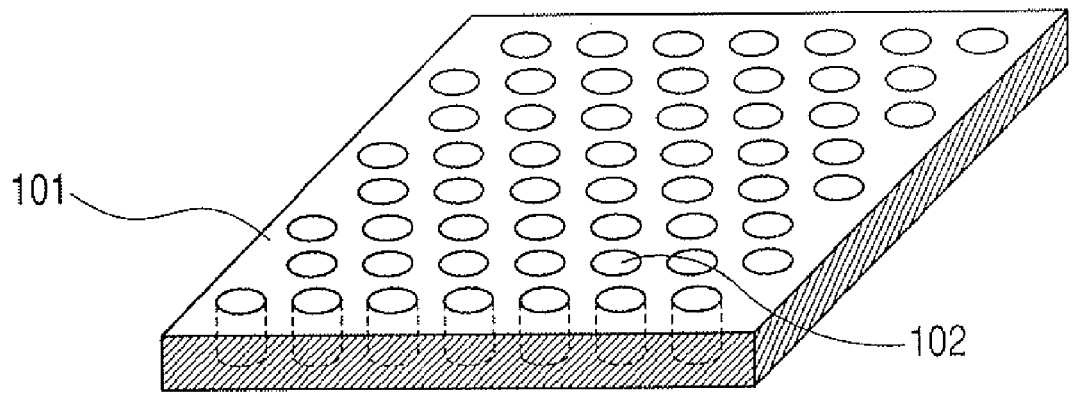
FIG. 1 is a schematic perspective view of a two-dimensional photonic crystal illustrating an embodiment of the present invention.

For instance, it is possible to modulate the refractive index in in-plane directions by boring micro holes 102 through a thin plate 101 of a semiconductor showing a high refractive index such as Si at a period substantially equal to the wavelength of light to be used with it as shown in FIG. 1.

Thus, it is possible to control the propagation of light in crystal in the directions in which the refractive index period is disposed by using photonic crystal.

Therefore, photonic crystal acts on light mainly in the in-plane directions in which the refractive index period is disposed. More specifically, it is possible to control light in various different ways. For instance, it is possible to confine light to a micro region, reduce the group velocity of light and change the direction of propagation of light.

As a particular characteristic of photonic crystal, it is known that light within a certain frequency band cannot exist in the inside of photonic crystal (and this frequency band is referred to as photonic band gap).

As portions where the periodicity is disturbed (defect portions) are introduced into photonic crystal, the characteristic of photonic band gap is lost in the defect portions. Then, light within the frequency band can exist there.

Thus, it is possible to confine light to a micro region by providing a photonic crystal with defect portions as a part thereof and surrounding them with photonic crystal.

It is also known that two-dimensional photonic crystal shows particular properties relative to light having a wave number component in a direction perpendicular to the crystal plane.

The property of photonic crystal of reflecting incident light by 100% described in the above-mentioned V. Lousse et al article is an example of such properties.

These properties of photonic crystal are mainly used for the purpose of the present invention.

Now, an arrangement where the refractive index distribution of a refractive index periodic structure changes continuously or quasi-continuously in a direction perpendicular to the reflector planes of the reflectors of a vertical cavity will be described below.

The vertical cavity surface emitting laser of this embodiment has an active layer between the first reflector layer and the second reflector layer and at least either the first reflector layer or the second reflector layer has a refractive index periodic structure where the refractive index distribution changes in a direction perpendicular to the reflector planes.

An arrangement where the refractive index distribution changes continuously or quasi-continuously in a direction perpendicular to the reflector planes will be specifically described here.

With the above described arrangement, it is possible to realize a vertical cavity surface emitting laser that has reflectors showing excellent reflection characteristics of a broad band and a high reflectivity and is mechanically highly stable as device. The underlying principle of a vertical cavity surface emitting laser according to the present invention will be described below particularly in terms of the properties of a photonic crystal reflector that is important in the laser by referring to an embodiment where a two-dimensional slab photonic crystal is used as reflector.

Figure 2:
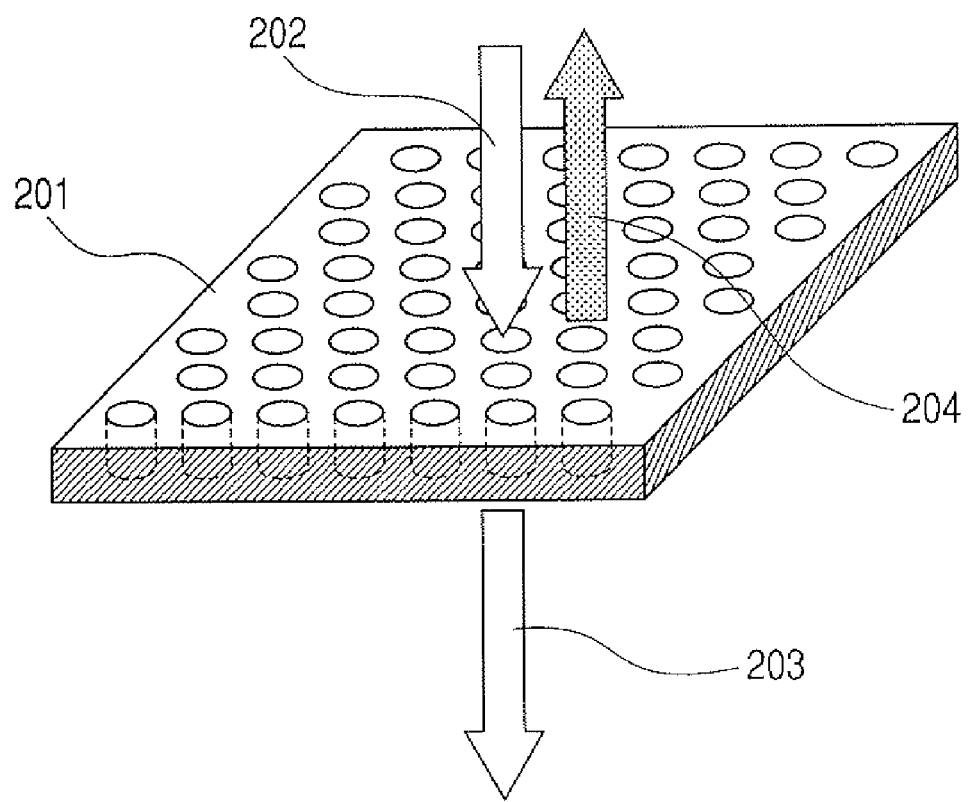
FIG. 2 is a schematic perspective view of a two-dimensional photonic crystal also illustrating an embodiment of the present invention.

Firstly, a photonic crystal reflector will be summarily described by referring to FIG. 2.

As light is made to strike a two-dimensional photonic crystal 201 in a direction substantially perpendicular to the crystal plane (incident light 202, transmitted light 203 and reflected light 204 are illustrated in FIG. 2), the transmission spectrum of light shows a complex profile.

The V. Lousse et al article theoretically proves that the reflectivity is 100% in three wavelength regions of 1,100 nm, 1,220 to 1,250 nm and around 1,350 nm and also shows a transmission spectrum in an infrared region.

Thus, a photonic crystal can be used as reflector by utilizing the above-described properties for reflection. As pointed out above, some of the problems of conventional vertical cavity surface emitting lasers can be dissolved by replacing the DBRs of the conventional vertical cavity surface emitting laser with a photonic crystal reflector. The above-described phenomenon occurs because light 202 entering in a direction substantially perpendicular to the two-dimensional photonic crystal is transformed to light that is propagating in the in-plane directions of the photonic crystal once and resonates in the in-plane directions before the light exits in the perpendicular direction at the side of incident light.

This will be described below by way of the energy-momentum dispersion relation of light propagating through the two-dimensional photonic crystal (to be referred as photonic band).

Figure 3:
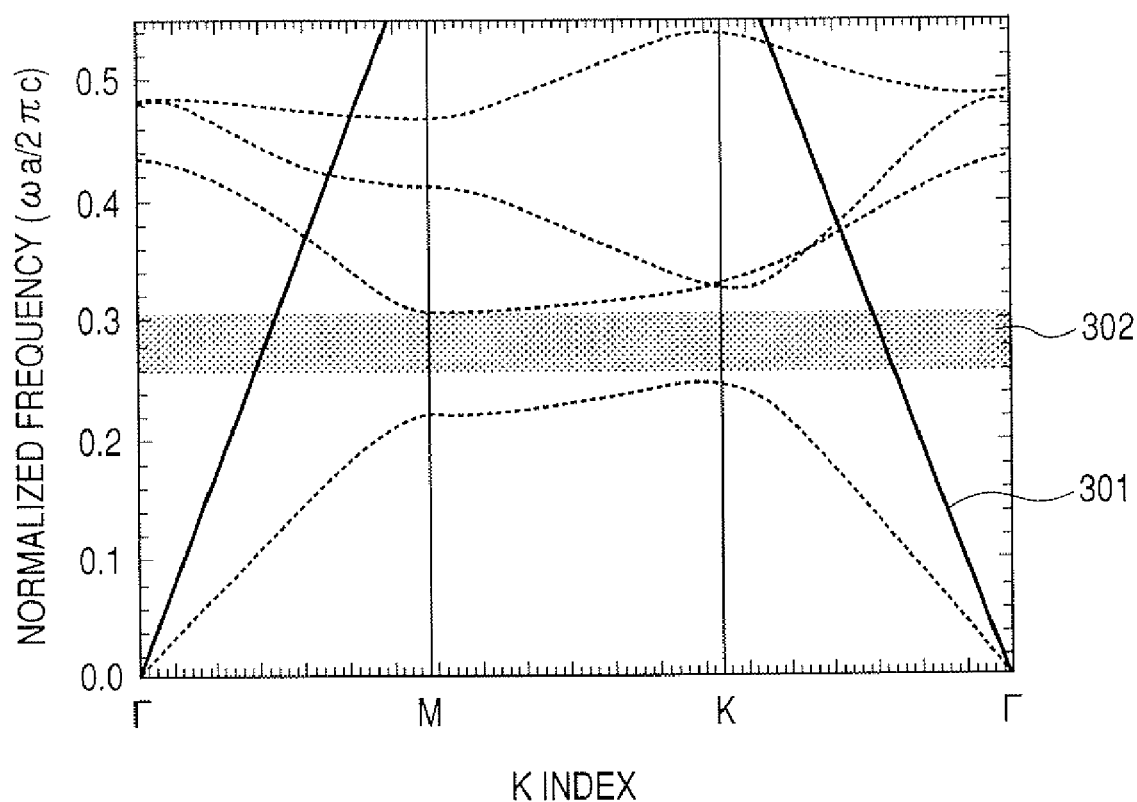
FIG. 3 is a graph illustrating a photonic band structure also illustrating an embodiment of the present invention.

FIG. 3 is a graph illustrating the photonic band of two-dimensional photonic crystal. In FIG. 3, the horizontal axis indicates the wave number vector and the vertical axis indicates the normalized frequency ($\omega a/2\pi c$: $\omega$ is the angular frequency of light and a is the lattice constant of the photonic crystal, whereas c is the light velocity in vacuum).

The above-described resonance in the in-plane directions appears only for light in modes that show an energy level higher than the light cone 301 in the photonic band structure.

More specifically, the resonance appears only for light expressed by the dispersion relation found in the regions above the boundary line (the lines of the light cone 301 in FIG. 3) where guided light in the two-dimensional slab gives rise to total reflection at the slab interface.

Thus, only incident light that is coupled to those modes is reflected by 100% by the photonic crystal reflector.

Note that the frequency of reflected light can be controlled by appropriately designing the crystal structure by means of a numerical simulation, using the FDTD (finite difference time domain) technique.

Now, an exemplary arrangement of photonic crystal where the refractive index changes continuously will be described below.

Figure 4:
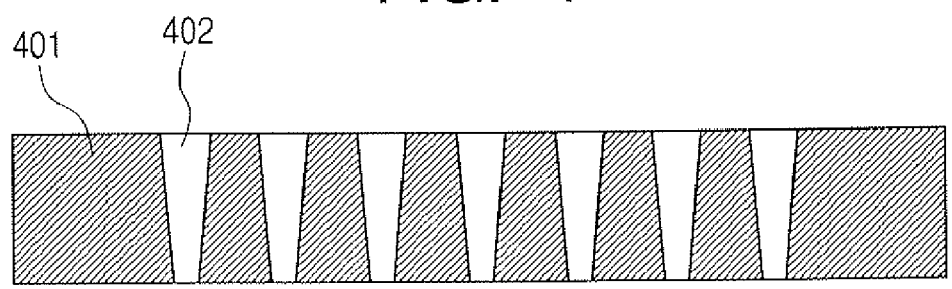
FIG. 4 is a schematic cross sectional view of a cavity reflector, illustrating a configuration thereof that can be used for an embodiment of the present invention.

FIG. 4 is a schematic cross sectional view of a two-dimensional slab photonic crystal, in which the hole diameter of the holes 402 formed through a thin semiconductor plate 401 is made to change continuously.

In the instance of FIG. 4, the hole diameter is gradually reduced toward the lower end in FIG. 4.

Among two-dimensional slab photonic crystals having the same slab thickness, those having a smaller hole diameter show a greater effective crystal period as reduced to optical path length.

The photonic band of photonic crystal shifts toward the long wavelength side when the crystal period is large.

Therefore, the reflection band of a photonic crystal reflector shifts toward the long wavelength side accordingly.

Figure 5:
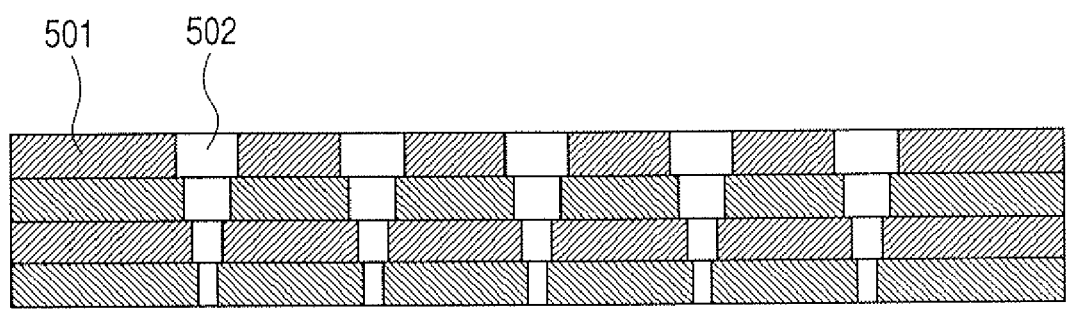
FIG. 5 is a schematic cross sectional view of a cavity reflector, illustrating another configuration thereof that can be used for an embodiment of the present invention.

For example, assume that the photonic crystal where the hole diameter changes continuously as shown in FIG. 4 is approximated by a multilayer of thin photonic crystals formed on a semiconductor flat plate 501 and having holes 502 whose hole diameter is changed from layer to layer as shown in FIG. 5.

Figure 6:
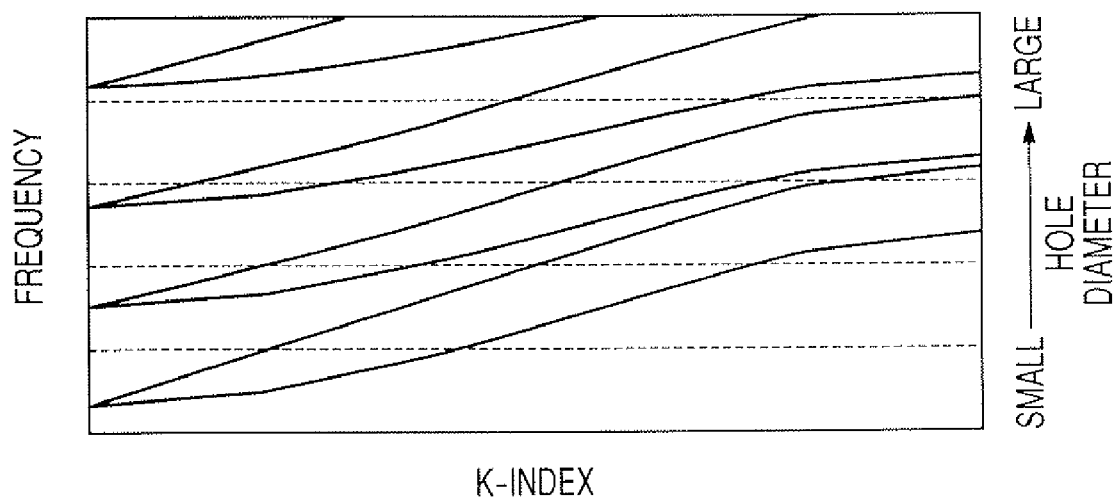
FIG. 6 is a graph illustrating the photonic band of each of the two-dimensional photonic crystals having different hole diameters (a graph of the photonic band of TM polarization) in an embodiment of the present invention.

FIG. 6 illustrates the photonic bands of TM polarized light for the arrangement of FIG. 5. As seen from FIG. 6, the photonic bands shifts toward the long wavelength side as the hole diameter is reduced.

While the photonic bands of an arrangement where the hole diameter shows four different patterns are illustrated above, the photonic band changes continuously or quasi-continuously when the hole diameter is made to change continuously or quasi-continuously.

Then, it is possible to produce a photonic band that is obtained by averaging the bands of the photonic crystals. Thus, an in-plane mode to be coupled with incident light is distributed continuously over a certain frequency band.

Now, the reflection characteristics of the two-dimensional photonic crystal reflector of this embodiment illustrated in FIG. 4 or 5 will be described below.

Figure 7A:
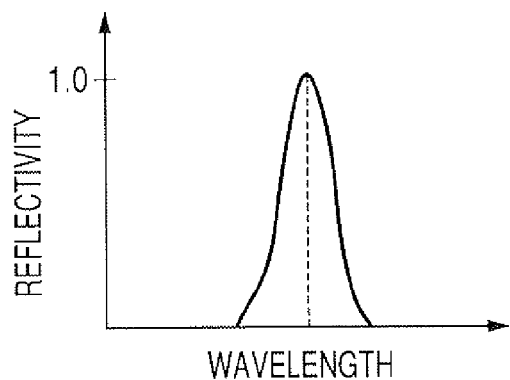
FIGS. 7A and 7B are graphs illustrating the reflection characteristics of the two-dimensional photonic crystal reflector of an embodiment of the present invention.
Figure 7B:
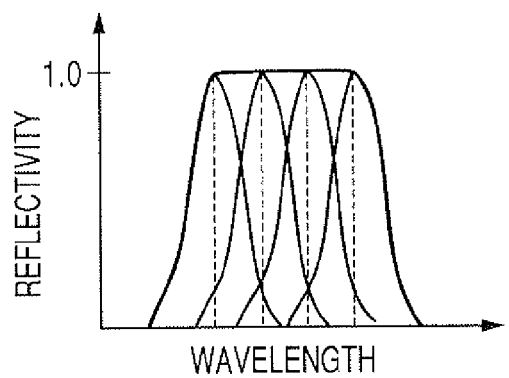

FIGS. 7A and 7B are graphs illustrating the reflection characteristics of a two-dimensional photonic crystal reflector. FIG. 7A is a graph illustrating the reflection characteristic of a two-dimensional photonic crystal reflector obtained relative to a single band. FIG. 7B is a graph illustrating the reflection characteristic of a two-dimensional photonic crystal reflector obtained relative to four bands.

While a single reflection frequency band is narrow for a two-dimensional photonic crystal reflector as shown in FIG. 7A, it is possible to broaden the reflection frequency band by putting a plurality of band together as shown in FIG. 7B.

Since this embodiment is arranged to make the photonic band change continuously or quasi-continuously, a reflection characteristic as indicated by the thick solid line connecting the peaks of the reflection characteristic curves of the four bands is obtained.

Thus, as a result, the range of wavelength where light can be reflected by 100% by means of a photonic crystal reflector is broadened. Then, the photonic crystal reflector shows excellent reflection characteristics of a broad band and a high reflectivity in operation.

The frequency band of a photonic crystal reflector having the above-described configuration is defined by the angle of inclination of the hole walls.

Therefore, the hole walls need to be inclined to a large extent to realize a broad reflection band. A photonic crystal reflector having holes that are inclined to such a large extent is mechanically highly stable compared to one having large diameter holes.

Thus, it is possible to realize a vertical cavity surface emitting laser that has reflectors showing excellent reflection characteristics of a broad band and a high reflectivity and is mechanically highly stable as device by employing the configuration of this embodiment.

As pointed out above, it is possible to realize a vertical cavity surface emitting laser that has reflectors showing excellent reflection characteristics of a broad band and a high reflectivity and is mechanically highly stable as device by adopting a configuration where the refractive index distribution of a refractive index periodic structure changes continuously in a direction perpendicular to the reflector planes. While the hole diameter of photonic crystal is linearly reduced from above toward below as shown in FIGS. 4 and 5 in the above description of the embodiment, the present invention is by no means limited to such a hole arrangement for the purpose of making a vertical cavity surface emitting laser according to the present invention operate effectively.

Any alternative arrangement may feasibly be employed for the purpose of the present invention so long as the hole diameter is made to change continuously or quasi-continuously.

For instance, an arrangement where the hole diameter is gradually increased after being reduced from above toward below or an arrangement where the hole diameter is changed not linearly but curvedly may alternatively be employed.

However, it will be appreciated that a simple hole profile like that of this embodiment is preferable rather than a complex hole profile from the viewpoint of processing facility.

Now, the spatial distribution of each of the mediums of the above described refractive index periodic structure that is made to change continuously in the direction perpendicular to the reflector planes will be described below.

As pointed out above, it is possible to make the spatial distribution of each of the mediums that form the reflector change in the direction perpendicular to the reflector planes in order to change the refractive index distribution of the photonic crystal reflector continuously or quasi-continuously in the direction perpendicular to the reflector planes.

A plurality of methods can be used for each reflector arrangement to change the refractive index distribution.

An example of such methods is to continuously change the hole diameter of the photonic crystal as described above. Methods that can be used for other arrangements will be described by way of examples hereinafter.

Now, an arrangement of raising the ratio of the high refractive index medium in an area located near the active layer of the vertical cavity will be described below.

When a reflector of the above described type is used for a laser cavity, it is preferable to raise the effective refractive index at the side of the active layer in the cavity (or in the inside of the cavity).

In the above-described instance, the effective refractive index is raised at the side where the hole diameter is smaller.

In such a case, incident light that is once put into an in-plane mode can be taken out to the active layer side with ease when the vertical cavity is formed with the side showing a large effective refractive index directed to the active layer of the cavity. Therefore, such an arrangement will be advantageous for the characteristics of the device.

Now, an arrangement where a plurality of portions that disorders the periodicity of the refractive index periodic structure will be described below.

As pointed out above, the defect portions of photonic crystal can confine light of frequencies in the photonic band gap.

The beams of light that are confined in defect portions come to be coupled with each other when the distances separating the defect portions are made to be found within a predetermined range.

Thus, it is possible to guide light that is made to strike the reflector perpendicularly and put into an in-plane guided mode over the entire emission region by way of the defect portions if light has frequencies in the photonic band gap.

The guided light is then put back into a radiation mode once again to become reflected light. Then, it is possible to provide the reflector with the features of expansion of single mode spots, beam shaping of emitted light and polarization control.

For the purpose of the present invention, defect portions of any type may be used so long as they disorder the periodicity of refractive index of photonic crystal.

In the instance of the two-dimensional photonic crystal reflector of the embodiment of FIG. 4, defect portions can be produced by partly removing holes (in other words, not producing holes or filling the holes in certain areas).

Defect portions can also be produced by boring holes of sizes different from the surrounding holes.

It is also possible to produce defect portions by making some of the holes not to have any inclined wall or an oppositely inclined wall relative to the surroundings.

Defect portions can also be produced by introducing a substance that shows a different refractive index to those portions.

While defect portions may be made to appear periodically or non-periodically, it is necessary that they are arranged at intervals that are found within a predetermined range so that the beams of light that are confined in the defect portions come to be coupled with each other.

The intervals may vary depending on the material and the configuration of the photonic crystal and the wavelength range of light to be guided.

For example, when holes are bored so as to form a triangular lattice (with a period a) in a slab and the photonic crystal shows a refractive index of about 3.5, while the slab has a thickness of 0.5 a and the hole diameter is 0.4 a, the intervals separating defect portions are preferably not less than two periods and not more than eight periods.

The expression of period as used herein refers to the period of the refractive index periodic structure.

Note that the lattice constant is used for normalization and only the requirements for the period are listed.

The requirements to be met for producing a photonic band gap will be described below. The dimension of a photonic band gap changes as a function of the difference of refractive index between the part of the photonic crystal that shows a high refractive index and the part of the photonic crystal that shows a low refractive index.

The photonic band gap is large when the difference of refractive index is large, whereas the photonic band gap is small when the difference of refractive index is small. The photonic band gap can disappear when the difference of refractive index is too small.

The difference of refractive index with which a photonic band gap can exist varies to a large extent depending on the shape and type of photonic crystal.

For example, in the case of a two-dimensional photonic crystal as shown in FIG. 1, the dimension of the photonic band gap can vary to a large extent depending on the size of the holes bored through the slab, or the base material, and the shape of the lattice.

In the case of two-dimensional photonic crystal, generally the photonic band gap is large when the lattice is triangular than when the lattice is rectangular.

The wavelength range of photonic band gap tends to be reduced in a photonic crystal where the hole diameter changes continuously in the direction perpendicular to the crystal plane as in the case of the above described embodiment.

Therefore, when a plurality of mediums that shows little difference of refractive index are used as materials of a photonic crystal, it is preferable to use a pattern of triangular lattice in order to reliably produce a photonic band gap.

Now, an arrangement where a reflector is prepared by bonding a plurality of two-dimensional refractive index periodic structures will be described below.

For the purpose of the present invention, a cavity reflector can be prepared by bonding a plurality of reflectors having a two-dimensional refractive index periodic structure. With such an arrangement, it is possible to make the refractive index distribution in the direction perpendicular to the reflector planes show a complex profile.

For example, the hole diameter of photonic crystal changes continuously and the holes are tapered as shown in FIG. 5 in the case of the above described embodiment.

Then, it is possible to prepare reflectors that show various different refractive index distribution patterns in the direction perpendicular to the reflector planes by bonding two or three reflectors.

More specifically, when bonding two reflectors, there are three different combinations of holes including one where the sides of the reflectors showing the larger hole diameters are bonded together, one where inversely the sides of the reflectors showing the smaller hole diameters are bonded together and one where the side of one of the reflectors showing the larger hole diameter is bonded to the side of the other reflector showing the smaller hole diameter.

These combinations can be appropriately be used when more than two reflectors are bonded to realize various distribution profiles. An example of such a combination will be described in Example 5.

While reflectors may be bonded at high temperature under high pressure, it is preferable to bond them at low temperature under low pressure in order to avoid the damage that thermal strain and pressure can give to the substrate.

Now, the materials that can be used for structures having photonic crystal will be described below.

The materials as listed below are preferable when a two-dimensional photonic crystal reflector is to be used as cavity reflector of a vertical cavity surface emitting laser.

While the preferable materials include metals, semiconductors and dielectrics, semiconductor materials and dielectric materials that transmit light of wavelengths emitted by means of oscillation of a laser are preferable materials.

While semiconductors and dielectrics may be used when optical excitation is employed for oscillations, the use of an electrically conductive semiconductor is preferable when a current injection is used for oscillations.

When an electric current is injected by way of a two-dimensional photonic crystal reflector, the portions showing a low refractive index are preferably made of a semiconductor having a refractive index smaller than the semiconductor used in the portions showing a high refractive index. Additionally, the thickness in the direction perpendicular to the plane of the two-dimensional photonic crystal is preferably smaller than a predetermined value so that a single transverse mode may be involved for light propagating through the crystal in the two-dimensional in-plane direction.

While the above-cited predetermined value may vary depending on the wavelength of propagating light and the material of the photonic crystal, it is possible to lead out the predetermined value by means of a known computation method (see, inter alia, K. Okamoto, "Fundamentals of Optical Waveguides", Chapter 2, Optronics).

For example, in the case of a silicon photonic crystal where the substance external to the photonic crystal is air in the direction perpendicular to the refractive index periodic structure of the photonic crystal, it is possible to make a single transverse mode to be involved by selecting a thickness not greater than 220 nm for the photonic crystal relative to propagating light having a wavelength of 1.5 µm.

Air or any other material can be used as the medium external to a two-dimensional photonic crystal in the direction perpendicular to the plane of photonic crystal.

However, when current injection is employed for oscillations, the use of a material as described below is preferable from the viewpoint of effectively confining light in the two-dimensional photonic crystal and injecting carriers into the active layer from the electrode on the reflector.

Namely, a semiconductor material that shows a refractive index lower than the material of the photonic crystal and is electrically conductive is preferable.

Now, the present invention will be described further by way of examples.

Note, however, while certain examples are given below, the present invention is by no means limited to Examples 1 through 5 below particularly in terms of the structural material, the size, the profile and other parameters of the laser device to be used for the purpose of the present invention.

EXAMPLE 1

The vertical cavity surface emitting laser prepared in Example 1 according to the present invention will be described below.

Figure 8A:
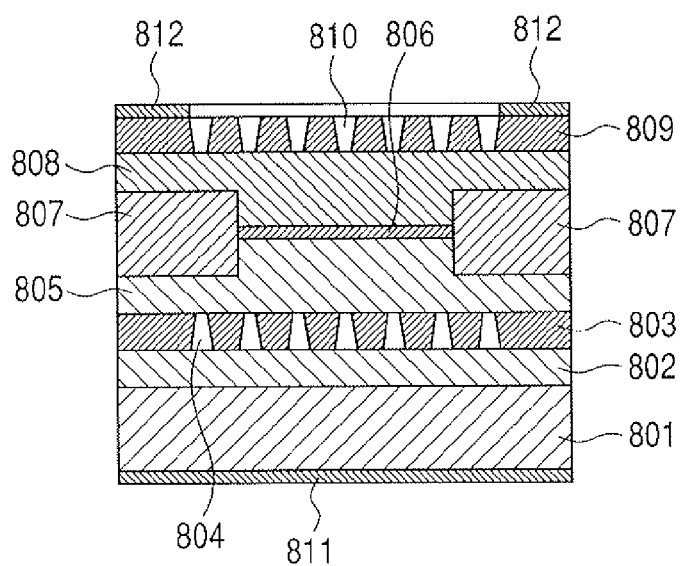
FIGS. 8A and 8B are schematic views of the vertical cavity surface emitting laser of Example 1 of the invention, illustrating the configuration thereof.
Figure 8B:
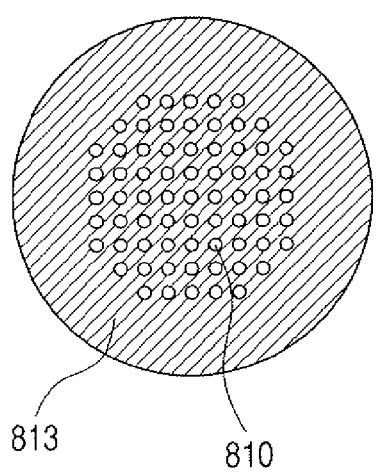

FIGS. 8A and 8B are schematic views of the vertical cavity surface emitting laser of this example, illustrating the configuration thereof. FIG. 8A is a schematic cross sectional view taken along a direction perpendicular to the substrate of the vertical cavity surface emitting laser of this example. FIG. 8B is a schematic plan view as viewed in the direction perpendicular to the surface of the cavity reflector of this example.

Referring to FIG. 8A, there are illustrated a substrate 801, a lower photonic crystal light-confining layer 802, a lower cavity reflector layer 803, lower cavity reflector photonic crystal holes 804, a lower clad layer 805, an active layer 806 and a current-confining layer 807.

FIG. 8A also illustrates an upper clad layer 808, an upper cavity reflector layer 809, upper cavity reflector photonic crystal holes 810, an n-electrode 811 and a p-electrode 812.

GaN type materials are used in this example.

The substrate is a 525 µm-thick GaN substrate and the lower photonic crystal light-confining layer is made of n-$Al_{0.5}Ga_{0.5}N$ and has a thickness of 540 nm, while the lower cavity reflector layer is made of n-GaN and has a thickness of 200 nm.

The lower clad layer is made of n-$Al_{0.5}G_{0.5}N$ and has a thickness of 540 nm. The active layer is made of $In_{0.02}Ga_{0.98}N/In_{0.1}Ga_{0.9}N$ to show a multiple quantum well structure.

The number of layers of the well is three and each of the layers has a thickness of 5 nm/2.5 nm. The buried heterostructure is formed by alternately laying two layers of p- and two layers of n-$Al_{0.3}Ga_{0.7}N$ to make the total thickness of the buried layer equal to 500 nm.

The upper clad layer is made of p-$Al_{0.3}Ga_{0.7}N$ and has a thickness of 540 nm. The upper cavity reflector layer is made of p-GaN and has a thickness of 240 nm.

The substrate side n-electrode is made of Ti/Al and deposited on the entire rear surface of the substrate by evaporation. The p-electrode is a ring-shaped electrode made of Ti/Pt/Au. The gap separating the upper and lower reflectors 803 and 809 (=the cavity length) is about 1.1 μm (corresponding to about 6.5 times of the wavelength of resonating light).

The above-described multilayer film can be prepared by way of the following steps.

Firstly, a GaN sacrifice layer is formed on a sapphire substrate by MOCVD and an $Al_{0.5}Ga_{0.5}N$ etching stop layer is formed thereon. Then, the layers from the upper cavity reflector layer through the lower cavity reflector layer are formed sequentially for the laser cavity structure.

For the purpose of lifting off the sapphire substrate in a later step, the layers on and above the GaN sacrifice layer and the $Al_{0.5}Ga_{0.5}N$ etching stop layer are formed sequentially from the upper cavity reflector layer to the lower cavity reflector layer in the inverted order relative to the order of arrangement of the layers of the actual device.

Then, a center part of the lower clad layer is circularly masked by resist and the surrounding part thereof is etched to dig off the active layer and remove an upper part of the upper clad layer by etching, using $Cl_2$+Ar gas.

The ICP etching that is conducted under this condition is referred to simply as dry etching in the below.

A buried hetero type current-confining layer is made to grow again on the etched-out area sequentially by n-GaN and p-GaN.

The surfaces of the buried layer and the lower clad layer are smoothed typically by CMP (chemical mechanical polishing) and subsequently the lower clad layer is made to grow thereon once again.

Then, the photonic crystal pattern is written by EB lithography on the lower cavity reflector layer that provides the uppermost surface and a photonic crystal reflector is formed by dry etching.

It is necessary to taper the holes of the photonic crystal so as to make the hole diameter may change continuously in the vertical direction. Such tapered holes can be produced by appropriately adjusting the dry etching conditions.

Such tapered holes can be produced relatively easily once the dry etching conditions are properly determined. It is desirable to know the etching conditions for different angles of inclination of holes.

Thereafter, a wafer is prepared by forming a lower cavity reflector light-confining layer on another n-GaN substrate and then the wafer of the sapphire substrate and the wafer of the GaN substrate are bonded to each other by hot bonding so as to make the lower cavity reflector layer and the lower cavity reflector light-confining layer face each other.

Then, the original sapphire substrate is removed from the structure produced by bonding the two wafers by means of laser lift-off of irradiating an Nd:YAG laser beam and then the surface of the GaN sacrifice layer is flattened and smoothed typically by CMP.

Thereafter, the GaN sacrifice layer is removed by ICP dry etching, using $Cl_2$+$O_2$ gas, from the flattened and smoothed surface and subsequently the $Al_{0.5}Ga_{0.5}N$ etching stop layer is removed by dry etching.

Then, the photonic crystal pattern of the upper cavity reflector layer is prepared by means of a technique similar to the one used for preparing the photonic crystal pattern of the lower cavity reflector layer and the n- and p-electrodes are formed respectively on the rear surface of the GaN substrate and on the upper cavity reflector layer by vacuum evaporation.

Now, the photonic crystal reflectors that form the cavity will be described below by referring to FIG. 8B.

In this Example, the upper and lower photonic crystal reflectors are identical except the parameter of the thicknesses of the layers. Therefore, only the upper photonic crystal reflector in FIG. 8A will be described below.

The photonic crystal structure is formed by periodically arranging holes 810 in the GaN layer.

Holes can be formed in the GaN layer by transferring a pattern that is formed by EB lithography by means of dry etching as described above.

The reflector of this example has tapered holes whose hole diameter changes gradually in the direction perpendicular to the planes of the reflector as shown in FIG. 8A. The lattice period of the cavity reflector is 200 nm and the hole diameter is maximally 160 nm and minimally 136 nm. The diameter changes at a constant rate relative to the height in the hole. While the hole diameter changes, the center positions of the holes do not change and held constant. In other words, the period of the photonic crystal structure does not change.

As for the tapered holes, the side showing the smaller hole diameter is made to face the active layer of the cavity in this example.

The reasons for these are described in the above embodiment.

Now, the positional relationship of the upper and lower reflectors will be described below.

Figure 9:
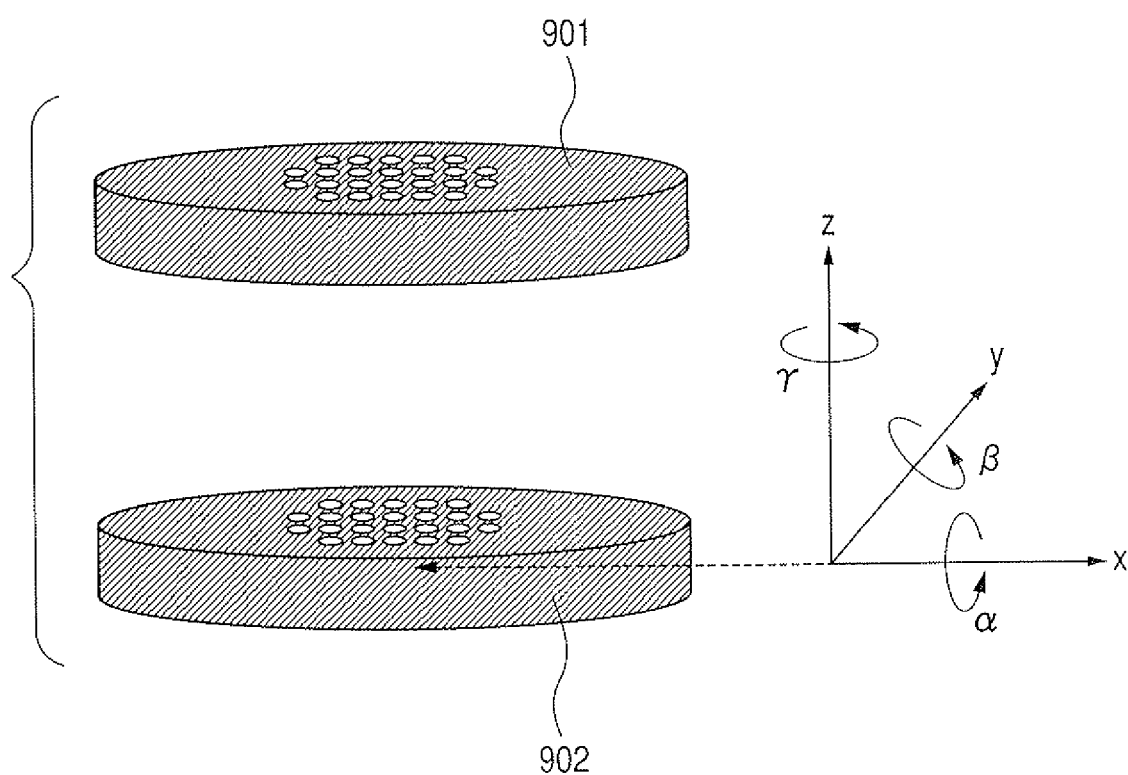
FIG. 9 is a schematic illustration of the two reflectors that form the cavity of Example 1 of the invention, illustrating the relative positional relationship thereof.

FIG. 9 is a schematic illustration of the two reflectors that form the cavity of this example, illustrating the relative positional relationship thereof.

The upper cavity reflector 901 and the lower cavity reflector 902 are shown in FIG. 9.

In FIG. 9, the coordinate system shows how the lower reflector is moved to take different relative positional relationships with the upper reflector.

As shown in FIG. 9, the relative positional relationship of the two reflectors can be changed by displacing the lower reflector in orthogonal directions of x, y and z turning it in the directions α, β and γ about the orthogonal axes x, y and z, hence with reference to a total of six directions.

Now, each of them will be described sequentially below.

As for the x- and y-directions, the requirements to be met for the positional relationship vary remarkably depending on the gap separating the two reflectors.

More specifically, the positional relationship of the two reflectors depends on the gaps separating them in the z-direction. When lights propagating in the in-plane directions of the two mirrors are separated only by a small gap so that they can be coupled with each other, the resonance characteristics vary enormously depending on the positional relationship of the reflectors in the x- and y-directions.

Thus, since the resonance characteristics are enormously affected by the positional relationship of the reflectors in the x- and y-directions, it is necessary to keep their positional relationship constantly unchanged in the x- and y-directions.

Additionally, if the gap is greater than the above-described extent, it is desirable to keep the positional relationship constantly unchanged. The value of the gap is defined by the material of the cavity, the material of the reflectors and the wavelengths of the lights that resonate.

The gap separating the reflectors is made large in the z-direction in order to avoid coupling of propagating lights in the reflectors of the cavity of this example.

As for the γ-direction, the resonance characteristics vary depending on the rotary angle in the γ-direction when the lights propagating in the in-plane directions of the two reflectors are separated only by a small gap so that they can be coupled with each other. Therefore, it is necessary to keep the rotary angle in the γ-direction constantly unchanged.

When, two propagating lights are not coupled in the in-plane directions of the two reflectors, the reflectors of this example do not have any polarization dependency so that the polarization characteristics of emitted light are not affected by rotation in the γ-direction.

However, even in such a case, it is desirable to keep the positional relationship of the reflectors constantly unchanged.

As for the z-direction, it is only necessary to adjust that the distance L between the two reflectors satisfies the requirements of resonance of the vertical cavity surface emitting laser as in the case of the cavity of an ordinary vertical cavity surface emitting laser.

As for the α- and β-directions, it is desirable to minimize the rotation of the lower reflector in those directions, ideally equal to nil so that the two reflectors are held in parallel with each other.

Note, however, when laser devices similar to that of this example are prepared collectively by means of crystal growth, any rotation in those directions can be substantially eliminated so that no particular adjustment is required.

In this example, any of the materials described below may be used for the lower cavity reflector light-confining layer 802 and the clad layers 805 and 808 so that resonating light transformed into propagating light in the in-plane directions may be effectively confined in the inside of the reflector.

Namely, $Al_{0.5}Ga_{0.5}N$ having a refractive index smaller than GaN that is the material of the reflector is used in the in-plane of the reflector.

For this purpose, it is also possible to use GaN for the clad layers like the cavity reflector layer and form a large number of holes that are sufficiently smaller than the holes of the photonic crystal of the reflector (to produce a so-called porous structure).

With such an arrangement, it is possible to lower the effective refractive index of the clad layers and confine resonating light that is transformed into propagating light in the in-plane directions to the inside of the reflector with ease.

Additionally, since the penetration depth of propagating light in the in-plane directions into the clad layers is reduced, it is possible to reduce the influence of coupling of resonating lights in the active layer and in the photonic crystal layer and also curtail the cavity length.

For both the upper and lower cavity reflectors, the light reflecting region produced by the above-described two-dimensional slab type photonic crystal is surrounded by a current injection region 813. No hole is formed in the current injection region in order to lower the electric resistance.

Therefore, only the region that is provided with a photonic crystal structure operates as reflector. The reflector region shows a circular profile with a diameter of 15 μmø.

The current-confining structure of this example is a buried heterostructure produced by crystal re-growth. Other current-confining structures that can be used for the purpose of the present invention include confining structures produced by selective oxidation of an AlN layer.

As the electrodes are electrically energized to inject an electric current into the active layer, light emitted from the active layer is resonated and amplified in the cavity to give rise to laser oscillations. The oscillation wavelength is 405 nm for blue light. The electric current is concentrated at a central part of the active layer by the confining structure to raise the light emission efficiency.

The mechanism of reflection of light by the upper and lower cavity reflectors is described above. Since the reflectivity for light in the direction perpendicular to the photonic crystal planes is close to 100%, photonic crystal can be used as vertical cavity reflector.

The reflection band of each of the reflectors can be broadened when the holes of the photonic crystal are tapered than when the holes are made to have vertical walls (see FIGS. 7A and 7B).

Then, if the reflection band is shifted due to preparation errors, the reflection bands of the upper and lower reflectors and the resonance wavelength of the cavity can be made to agree with each other with ease. Thus, it is possible to produce low performance laser devices at a minimum rate and raise the manufacturing yield.

The reflection band is about 30 nm between 385 and 415 nm in this example. This value can be increased by increasing the inclination of the hole walls.

While the two cavity reflectors of this example are realized by so many photonic crystal reflectors, one of them may be replaced by a DBR that is formed by a multilayer film.

While GaN/InGaN/AlGaN is used for the active layer and some of the other component layers of the device to produce a blue laser beam in this example, the present invention is by no means limited thereto.

For example, any of other Group III-V semiconductors such as GaAs/AlGaAs, InGaAsP/InP, AlGaInP/InGaP and GaInNAs/AlGaAs or a mixed crystal of any of them may alternatively be used for the purpose of the present invention.

Still alternatively, any of Group II-VI semiconductors such as ZnSe/CdSe/ZnS and a mixed crystal of any of them may be used for the purpose of the present invention.

EXAMPLE 2

The vertical cavity surface emitting laser prepared in Example 2 according to the present invention will be described below.

Figure 10:
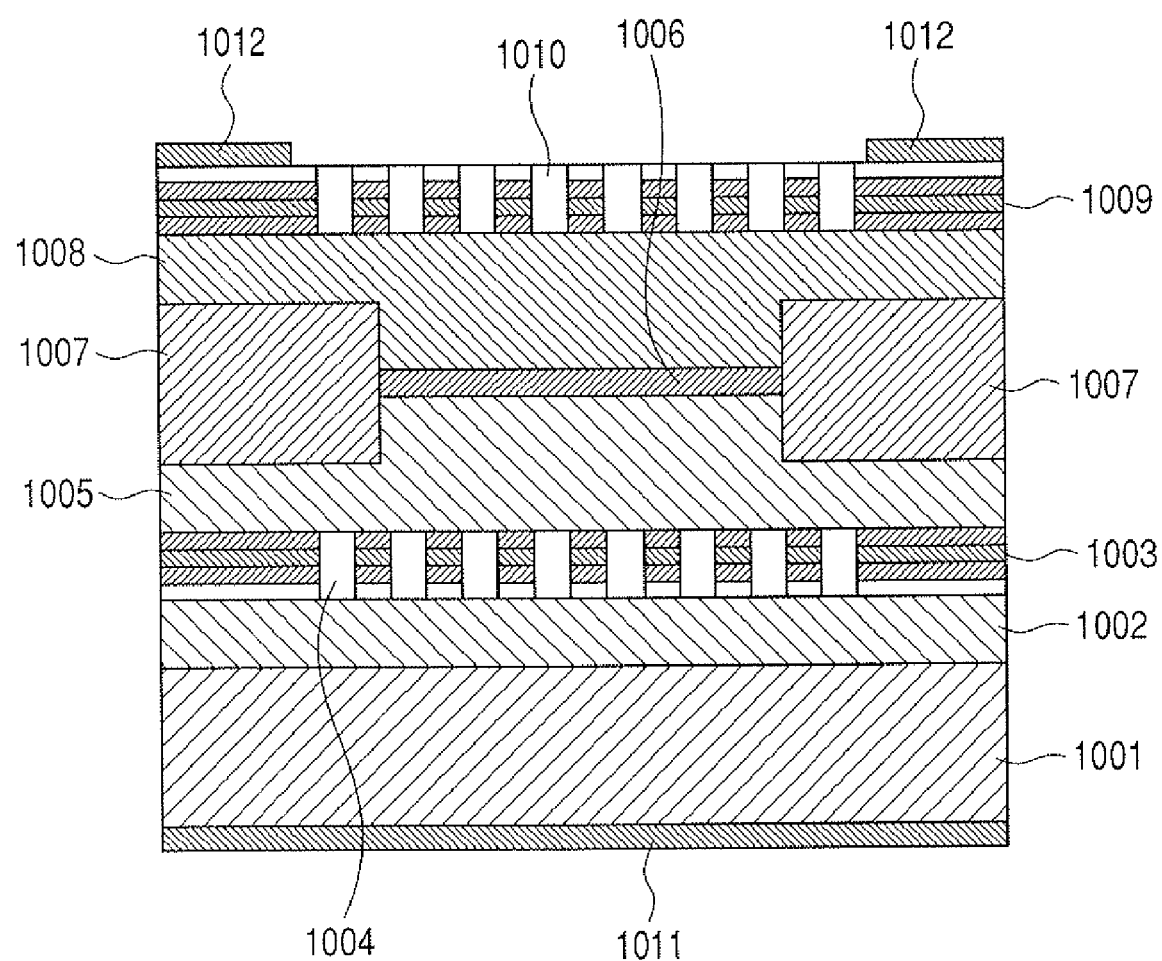
FIG. 10 is a schematic cross sectional view of the vertical cavity surface emitting laser of Example 2 of the invention taken along a direction perpendicular to the substrate.

FIG. 10 is a schematic cross sectional view of the vertical cavity surface emitting laser of Example 2 taken along a direction perpendicular to the substrate.

Referring to FIG. 10, there are illustrated a substrate 1001, a lower photonic crystal light-confining layer 1002, a lower cavity reflector layer 1003, lower cavity reflector photonic crystal holes 1004, a lower clad layer 1005, an active layer 1006 and a current-confining layer 1007.

FIG. 10 also illustrates an upper clad layer 1008, an upper cavity reflector layer 1009, upper cavity photonic crystal holes 1010, an n-electrode 1011 and a p-electrode 1012.

In this example, the substrate is a 525 μm-thick GaAs substrate and the lower photonic crystal light-confining layer is made of n-$Al_{0.8}Ga_{0.2}As$ and has a thickness of 500 nm, while the lower clad layer is made of n-$(Al_{0.5}Ga_{0.5})_{0.5}In_{0.5}P$ and has a thickness of 735 nm.

The active layer is made of non-doped $Ga_{0.56}In_{0.44}P/(Al_{0.5}Ga_{0.5})_{0.5}In_{0.5}P$ to show a strained quantum well structure. The number of layers of the well is three and the well layer and the confinement layers each have a thickness of 6 nm.

The upper clad layer is made of p-$(Al_{0.5}Ga_{0.5})_{0.5}In_{0.5}P$ and has a thickness of 735 nm. The substrate side n-electrode is made of Ni/Au/Ge and deposited on the entire rear surface of the substrate by evaporation. The p-electrode is a ring-shaped electrode made of Au—Zn.

The gap separating the upper and lower reflectors 1003 and 1009 (=the cavity length) is about 1.5 μm (corresponding to about 7.5 times of the wavelength of resonating light).

Now, the upper and lower cavity reflector layers will be described below.

Figure 11A:
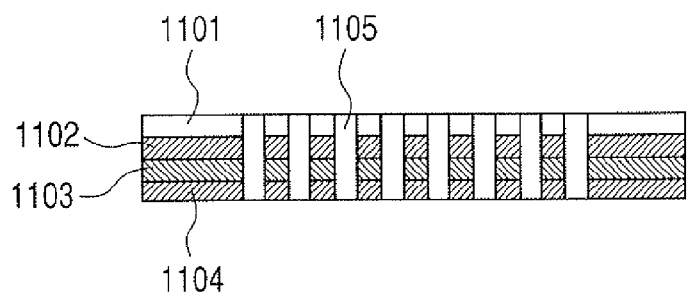
FIGS. 11A and 11B are schematic views of the photonic crystal reflector of Example 2 of the invention.
Figure 11B:
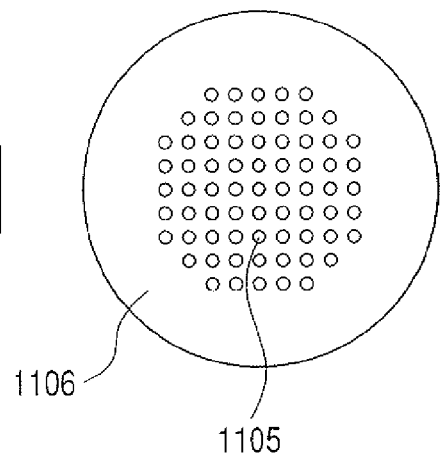

FIGS. 11A and 11B are schematic views of the photonic crystal reflector of Example 2.

FIG. 11A is a schematic cross sectional view taken along a direction perpendicular to the photonic crystal surface. FIG. 11B is a schematic plan view as viewed in the direction perpendicular to the photonic crystal surface.

In this Example, the two reflectors are identical except the thicknesses of the reflectors. Therefore, only the upper cavity reflector as shown in FIGS. 11A and 11B will be described below.

Referring to FIG. 11A, the layers 1101 through 1104 are made of $Al_xGa_{(1-x)}As$ with the value of x varied from layer to layer. The specific values of x are x=0.7, 0.6, 0.5 and 0.4 sequentially from the layer 1101.

The total thickness of the reflector is 330 nm and the thicknesses of the layers 1101 through 1104 are 86, 84, 82 and 79 nm respectively.

The thickness of each of the layers is determined by taking the refractive index into consideration so as to make the optical path lengths equal to each other. Holes 1105 constitute the photonic crystal. In this example, the hole walls are arranged perpendicular relative to the photonic crystal planes.

The period of holes of the photonic crystal is 235 nm and the diameter of the holes is 175 nm.

The region 1106 in FIG. 11B forms a ring-shaped electrode. An electric current is injected from there.

The lower cavity reflector layer has a thickness of 440 nm and the configuration, the period of holes and the diameter of the holes are the same as those of the upper cavity reflector.

However, since the total thickness of the lower cavity reflector is greater than that of the upper cavity reflector, the thicknesses of the component layers $Al_xGa_{(1-x)}As$ (x=0.7, 0.6, 0.5 and 0.4) are made to be 117, 111, 108 and 104 nm, respectively.

The positional relationship of the upper and lower photonic crystal reflectors is the same as that of Example 1.

The above-described multilayer film can be prepared by way of the following steps.

Firstly, an upper cavity reflector layer (four $Al_xGa_{(1-x)}As$ layers with varied values of x), an upper clad layer, an active layer, a lower clad layer and a lower cavity reflector layer are sequentially formed on a GaAs substrate by MOCVD.

Here again, the order of forming the layers is inverted relative to that of FIG. 10 for the purpose of removing the substrate in a later step.

Then, the photonic crystal pattern is written thereon by EB lithography and the photonic crystal holes of the lower cavity reflector are formed by dry etching. The prepared work is used as wafer A.

The lower photonic crystal light-confining layer is made to grow on another GaAs substrate and the prepared work is used as wafer B.

Then, the lower photonic crystal light-confining layer of the wafer B is bonded onto the lower cavity reflector layer of the wafer A by hot bonding.

The GaAs substrate of the wafer A is polished and thinned to show a thickness of several micrometers and then the GaAs substrate is removed by dry etching.

After removing the GaAs substrate, a photonic crystal pattern is formed on the upper cavity reflector layer as in the case of the lower cavity reflector layer. Then, the current-confining layer is formed by injecting protons. The basic structure of the laser cavity is completed as a result of the above-described steps.

Finally, the n- and p-electrodes are formed by evaporation respectively on the rear surface of the GaAs substrate and the upper cavity reflector layer and the electrodes are turned into alloys by annealing them by heat.

Now, the characteristics of the photonic crystal parts of the upper and lower cavity reflectors will be described below.

As shown in FIG. 11A, since each of the cavity reflectors is formed from a number of $Al_xGa_{(1-x)}As$ layers with varied values of x, the refractive index is changed quasi-continuously in the direction perpendicular to the reflector planes. The change in the refractive index corresponds to the change in the period of the photonic crystal and the photonic band structure of each of the layers changes at the rate same as that of the change in the refractive index.

Since the layers operate as a single reflector and the reflection characteristics of the reflector are obtained by averaging the reflection characteristics of the layers. Thus, the reflectors of this example provide advantages similar to those of the reflectors of Example 1 where the holes are tapered.

It is possible to broaden the reflection band of each of the cavity reflectors of this example. The obtained reflection bands of the upper and lower reflectors are respectively 650 through 710 nm and 640 through 700 nm.

While each of the reflectors is formed by using four film layers in this example, the change in the refractive index distribution in the direction perpendicular to the reflector planes can be made smoother by reducing the thickness of each film layer and making the value of x vary with smaller steps.

As the electrodes are electrically energized to inject an electric current into the device, light emitted from the active layer is resonated and amplified in the cavity to give rise to laser oscillations. The oscillation wavelength is 670 nm for red light.

The electric current is concentrated at a central part of the active layer by the current-confining structure to raise the light emission efficiency.

While the current-confining structure is prepared by way of a process for raising the resistance by injecting protons, a buried heterostructure prepared by crystal re-growth or a confining structure prepared by selective oxidation of an Al(Ga)As layer may alternatively be used for the purpose of the present invention.

While the two cavity reflectors of this example are realized by so many photonic crystal reflectors, one of them may be replaced by a DBR that is formed by a multilayer film.

While GaAs/AlGaAs is used for the reflector layers and AlGaInP/GaInP is used for the active layer and the clad layers to produce a red laser beam in this example, the present invention is by no means limited thereto.

For example, any of other Group III-V semiconductors such as GaN/InGaN/AlGaN, InGaAsP/InP, GaInNAs/AlGaAs or a mixed crystal of any of them may alternatively be used. Still alternatively, any of Group II-VI semiconductors such as ZnSe/CdSe/ZnS and a mixed crystal of any of them may be used for the purpose of the present invention.

EXAMPLE 3

The vertical cavity surface emitting laser prepared in Example 3 according to the present invention will be described below.

Since the configuration and the materials of the vertical cavity surface emitting laser of this example are the same as those of Example 2 except the cavity reflectors, only the cavity reflectors of this example will be described below.

Figure 12A:
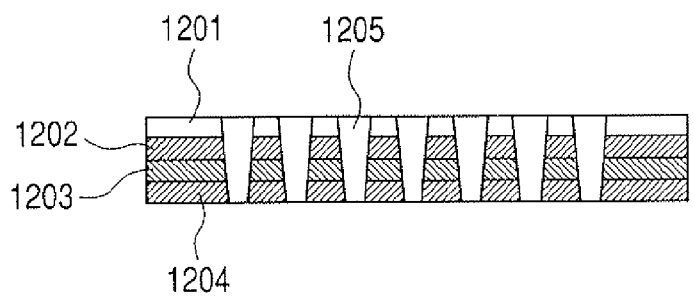
FIGS. 12A and 12B are schematic views of the photonic crystal reflector of Example 3 of the invention.
Figure 12B:
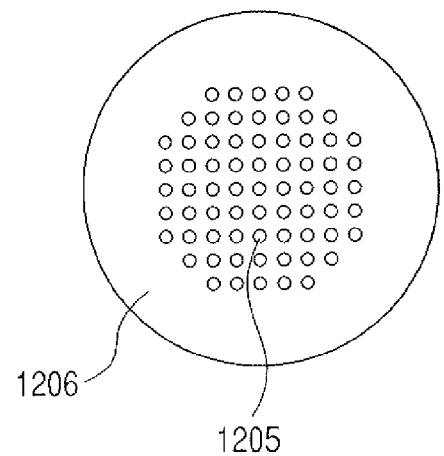

FIGS. 12A and 12B are schematic views of the photonic crystal reflector of Example 3.

FIG. 12A is a schematic cross sectional view taken along a direction perpendicular to the surface of the photonic crystal. FIG. 12B is a schematic plan view as viewed in the direction perpendicular to the surface of the photonic crystal.

In this Example, the two reflectors are identical except the thicknesses of the reflectors. Therefore, only the upper cavity reflector in FIGS. 12A and 12B will be described below.

Referring to FIG. 12A, the layers 1201 through 1204 are made of $Al_xGa_{(1-x)}As$ with the value of x varied from layer to layer. The thickness of the reflector and the composition and the thickness of each of the layers are the same as those of its counterpart of Example 2.

Holes 1205 constitute the photonic crystal. In this example, the hole walls are tapered relative to the photonic crystal planes.

The period of holes of the photonic crystal is 235 nm and the diameter of the holes is 190 nm at maximum and 160 nm at minimum. The region 1206 in FIG. 12B forms a ring-shaped electrode. An electric current is injected from there as in Example 2.

The positional relationship of the upper and lower photonic crystal reflectors is the same as those of Examples 1 and 2.

The above-described multilayer film can be prepared by way of the following steps.

As pointed out above, the configuration of the device of this example is identical with that of the device of Example 2 except the profile of the photonic crystal holes of the cavity reflectors.

Therefore, the steps and the sequence of the process for manufacturing the entire device is identical with those of Example 2. As for the reflectors, the holes can be tapered by adjusting the dry etching parameters in the process of forming photonic crystal holes. Therefore, only the etching conditions are different from those of Example 2.

Now, the functional features of the cavity reflectors of this example will be described below.

Each of the cavity reflectors of this example is a photonic crystal reflector prepared by periodically forming holes in the number of film layers that are $Al_xGa_{(1-x)}As$ layers with varied values of x as in Example 2.

However, in this example, the holes are tapered as in Example 1 and the hole diameter is changed in the direction perpendicular to the reflector planes continuously at a constant rate.

With this arrangement, both that the reflectors are made of a number of film layers with respective compositions that are varied to a small extent and that the holes are tapered contribute to the effective periodic change of the photonic crystal.

Thus, the photonic band characteristic of each of the reflectors of this example is broadened due to the tapered holes of the photonic crystal if compared with Example 2 where the reflector has the same composition and so is the reflection band of the reflector.

The ranges of reflection of the reflectors of this example are 615 through 725 nm for the upper reflector and 625 through 735 nm for the lower reflector.

With the arrangement of this example, a photonic crystal surface emitting laser is formed by using broader band reflectors. Thus, it is possible to supply surface emitting laser devices that operate highly stably and raise the manufacturing yield.

However, since each of the cavity reflectors is formed from a number of $Al_xGa_{(1-x)}As$ layers with varied values of x, the dry etching process for tapering the holes is more difficult that that of Example 1. While the two cavity reflectors of this example are realized by so many photonic crystal reflectors, one of them may be replaced by a DBR that is formed by a multilayer film.

EXAMPLE 4

The vertical cavity surface emitting laser prepared in Example 4 according to the present invention will be described below.

Since the configuration and the materials of the vertical cavity surface emitting laser of this example are the same as those of Example 1 except the cavity reflectors, only the cavity reflectors of this example will be described below.

Figure 13A:
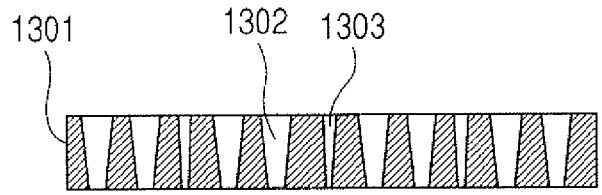
FIGS. 13A and 13B are schematic views of the photonic crystal reflector of Example 4 of the invention.
Figure 13B:
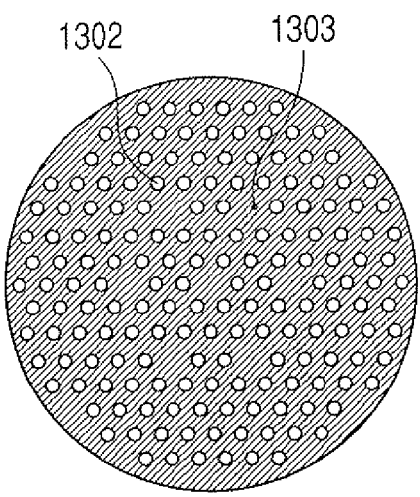

FIGS. 13A and 13B are schematic views of the photonic crystal reflector of Example 4.

FIG. 13A is a schematic cross sectional view taken along a direction perpendicular to the surface of the photonic crystal. FIG. 13B is a schematic plan view as viewed in the direction perpendicular to the surface of the photonic crystal.

In this Example, the two reflectors are identical except the thicknesses of the reflectors. Therefore, only the upper cavity reflector shown in FIGS. 13A and 13B will be described below.

In FIGS. 13A and 13B, there are illustrated a thin film 1301 that forms the cavity reflector, holes 1302 of the photonic crystal and portions (defect portions) 1303 that disorder the periodic structure of the photonic crystal.

The upper cavity reflector has a thickness of 240 nm while the lower cavity reflector has a thickness of 200 nm. All the other parameters of the upper cavity reflector are the same and identical with those of the lower cavity reflector.

In this example, the photonic crystals of the cavity reflectors show a triangular lattice.

The hole period of each of the cavity reflectors is 160 nm and the hole diameter is maximally 130 nm and minimally 110 nm (and half of each of them in the defect portions). The obtained reflection bands of the upper and lower cavity reflectors are respectively 383 through 418 nm and 385 through 416 nm.

The preparing steps for the device including the reflector of FIGS. 13A and 13B of this example are substantially the same as those of Example 1 because the configuration of the device is substantially the same as that of the device of Example 1.

The device of this example differs from that of Example 1 only in terms of the process for preparing the cavity reflectors showing a triangular lattice introduced with defect portions.

More specifically, when preparing the photonic crystal section of each of the reflectors, the hole diameter of the defect portions is reduced to a half of that of the surrounding photonic crystal by EB lithography. Subsequently, the reflectors are prepared by dry etching.

The photonic crystal reflectors having defect portions are prepared in this way. Additionally, in this example, each of the cavity reflector layers is provided with holes over the entire area thereof and defect portions are formed only in the light emitting section thereof.

Now, the functional features of the cavity reflectors of this example will be described below.

A defect portion (where the diameter of holes is a half of that of holes in the surrounding photonic crystal) is introduced at every three periods of holes of photonic crystal in the light reflecting section of the cavity reflector of FIGS. 13A and 13B.

While defect portions are shown only for two periods in FIG. 13A, defect portions are actually formed for about 15 periods.

Resonating light that is transformed into an in-plane guided mode in the photonic crystal is localized to a defect and coupled with light in a guided mode that is localized to an adjacent defect.

Since such lights are strongly coupled in-plane, it is possible to increase the size of the spot of light that is emitted in a state where the transverse mode is a single mode.

Additionally, since the wavelength of oscillated light is exactly falls within the wavelength range of the photonic band gap in the photonic crystal in the surrounding region that is free from defects, oscillated light cannot propagate in such regions.

Thus, a laser beam is emitted only from the regions where a defect is formed at a center part and it is possible to prevent light from leaking in the in-plane directions of the cavity reflectors.

As the laser device is electrically energized, light discharged from the active layer is resonated and amplified in the cavity to give rise to laser oscillations.

The oscillation wavelength is 405 nm for blue light. The electric current is concentrated at a central part of the active layer by the current-confining structure to raise the light emission efficiency.

While defects are introduced at a period of three times of the basic period of the photonic crystal in this example, they can alternatively be introduced at some other period.

Additionally, defects may not necessarily be introduced periodically. In other words, they may be introduced non-periodically. In any case, defects needs to be introduced at such distances that lights localized in the defects can be coupled with each other over the distances.

While defect portions are produced in this example by reducing the hole diameter of the ordinary holes of the photonic crystals in this example, they may alternatively be produced by enlarging the hole diameter or removing holes.

While the two cavity reflectors of this example are realized by so many photonic crystal reflectors, one of them may be replaced by a DBR that is formed by a multilayer film.

Thus, it is possible to broaden the reflection band of each of the reflectors and additionally enlarge the spot size by introducing defects in a manner as described above for this example into photonic crystal reflectors having tapered holes as described above by referring to Example 1 for the above described reasons.

EXAMPLE 5

The vertical cavity surface emitting laser prepared in Example 5 according to the present invention will be described below.

Figure 14:
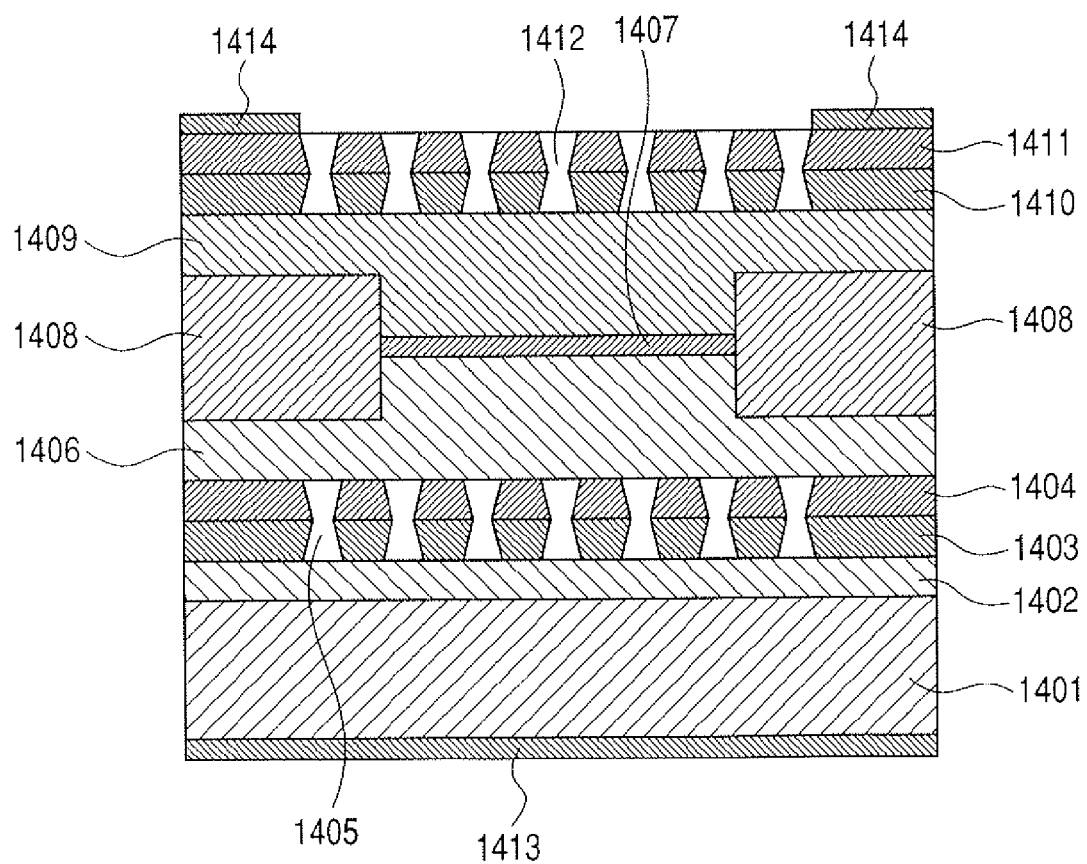
FIG. 14 is a schematic cross sectional view taken along a direction perpendicular to the substrate of the vertical cavity surface emitting laser of Example 5 of the invention.

FIG. 14 is a schematic cross sectional view of the vertical cavity surface emitting laser of Example 5 taken along a direction perpendicular to the substrate.

Referring to FIG. 14, there are illustrated a substrate 1401, a lower photonic crystal light-confining layer 1402, a lower first cavity reflector layer 1403, a lower second cavity reflector layer 1404, lower cavity reflector photonic crystal holes 1405 and a lower clad layer 1406.

FIG. 14 also illustrates an active layer 1407, a current-confining layer 1408, an upper clad layer 1409, an upper first cavity reflector layer 1410, an upper second cavity reflector layer 1411 and upper cavity reflector photonic crystal holes 1412.

FIG. 14 additionally illustrates an n-electrode 1413 and a p-electrode 1414.

As in Example 1, GaN/AlGaN/InGaN type semiconductors are also used as materials in this example.

The configuration of the device, the parameters, the materials and the material compositions of this example are basically the same as those of Example 1. The differences between this example and Example 1 will be listed below.

Firstly, each of the cavity reflectors is formed by using two photonic crystals and GaN is used as material.

The cavity length is made shorter and equal to 940 nm (about 5.5 times of the wavelength) and the upper and lower clad layers are as thick as 460 nm accordingly.

The device of this example can be prepared in a manner as described below.

Firstly, a GaN sacrifice layer, an $Al_{0.5}Ga_{0.5}N$ etching stop layer, an upper cavity first reflector layer, an upper clad layer, an active layer and a lower clad layer are formed sequentially on a sapphire substrate.

For the purpose of removing the sapphire substrate of the wafer and bonding an upper cavity second reflector is bonded to the wafer in a later step, the arrangement of the layers relative to the substrate is inverted from the layer arrangement of FIG. 14 as in Example 1.

Then, a center part of the lower clad layer is circularly masked by resist and the surrounding part thereof is etched to dig off the active layer and remove an upper part of the upper clad layer by dry etching.

A buried hetero type current-confining layer is made to grow on the etched-out area again sequentially by n-GaN and p-GaN twice.

The surfaces of the buried layer and the lower clad layer are smoothed typically by CMP and subsequently the lower clad layer is made to grow thereon once again.

Then, the lower cavity second reflector layer is formed on the grown lower clad layer and the holes of the photonic crystal are formed by EB lithography and dry etching.

Holes are formed only in the lower cavity second reflector in this step and the photonic crystal structure is formed by adjusting the etching conditions so as to taper the holes in an inverted manner relative to those of Example 1.

More specifically, the holes are tapered in an inverted manner relative to those of Example 1 (to be referred to as inversely tapered hereinafter) and hence the hole diameter is increased as the holes are bored progressively from the etching surface.

The inclination of the hole walls is doubled to that of the holes of Example 1. This can be realized by appropriately adjusting the dry etching conditions.

The wafer prepared in a manner as described above is referred to as wafer A.

Then, a lower cavity reflector light-confining layer and a lower cavity second reflector layer are sequentially formed on a GaN substrate in the above listed order and a photonic crystal pattern is formed thereon by means of EB lithography and dry etching.

Again, the holes are inversely tapered as in the case of the lower cavity first reflector layer.

This wafer is referred to as wafer B. Then, a GaN sacrifice layer and an $Al_{0.5}Ga_{0.5}N$ etching stop layer are formed sequentially on another sapphire substrate.

Thereafter, an upper cavity second reflector layer is formed thereon and a pattern of photonic crystal holes that are also inversely tapered is formed. This wafer is referred to as wafer C.

After preparing the wafers in this way, the bonding step is started.

In the bonding step, firstly the surface of the lower cavity first reflector of the wafer B is bonded onto the lower cavity second reflector of the wafer A by hot bonding.

The bonding operation is conducted so as to make the positions of the alignment marks that are formed in advance agree with each other in order to accurately align the holes of the two wafers. As a result of this step, firstly the lower cavity reflector is completely prepared. Then, the sapphire substrate of the wafer A is removed by laser lift-off of irradiating an Nd:YAG laser beam and the surface of the GaN sacrifice layer is smoothed typically by CMP.

Thereafter, the GaN sacrifice layer is removed down to the $Al_{0.5}Ga_{0.5}N$ etching stop layer by ICP dry etching, using $Cl_2+O_2$ gas.

Subsequently, the photonic crystal pattern of the upper cavity first reflector layer is formed also with inversely tapered holes and the surface of the upper cavity second reflector of the wafer C is bonded like the lower cavity reflector.

Then, the sapphire substrate is removed by means of the technique used for removing the sapphire substrate of the wafer A to complete the process of preparing the upper cavity reflector. Finally, the n-electrode and the p-electrode are formed respectively on the rear surface of the GaN substrate and on the upper cavity second reflector layer by evaporation.

The positional relationship of the upper and lower cavity reflectors of this example is the same as that of Example 1.

As for the positional relationship of the first reflector and the second reflector of each of the upper and lower cavity reflectors, the holes of the first and second reflectors have to be aligned as accurately as possible because the two reflectors operate as a single reflector when put together.

The total thickness of the upper cavity reflector and that of the lower cavity reflector that are formed by respectively bonding the first reflectors and the second reflectors of this example are the same as the thickness of the upper cavity reflector and that of the lower cavity reflector of Example 1. In other words, the first reflectors and the second reflectors respectively have a thickness that is a half of the total thicknesses.

The period of the photonic crystal holes is the same as that of Example 1. The maximum diameter and the minimum diameter of the holes are the same as those of Example 1. Thus, the holes are inclined twice as much as those of Example 1.

In this example, the two layers of each of the cavity reflectors are bonded together and the hole diameter of each of the two layers is gradually reduced toward the bonding boundary so that the hole diameter becomes minimal at the boundary. This structure of each of the cavity reflectors is the same as that of the corresponding one of Example 1 in the sense that the hole diameter changes continuously. Therefore, the band broadening effect that is obtained as a result is the same in the two examples.

However, from the viewpoint of the average refractive index of each of the reflectors, the average refractive index is maximized at the middle section (bonding section) thereof so that the middle section of the reflector can confine light efficiently. Additionally, since the penetration depth in the clad layer is reduced, it is possible to reduce the influence of the coupling with the active layer so that consequently the cavity length can be reduced.

As the laser device of this example is electrically energized, light emitted from the active layer is resonated and amplified in the cavity to give rise to laser oscillations. The oscillation wavelength is 405 nm for blue light. The electric current is concentrated at a central part of the active layer by the current-confining structure to raise the light emission efficiency.

While the two cavity reflectors of this example are realized by so many photonic crystal reflectors, one of them may be replaced by a DBR that is formed by a multilayer film.

While GaN/InGaN/AlGaN is used for the active layer and some of the other layers of the device to produce a blue laser beam in this example, the present invention is by no means limited thereto.

For example, any of other Group III-V semiconductors such as GaAs/AlAs, InGaAsP/InP, AlGaInP/InGaP and GaInNAs/AlGaAs or a mixed crystal of any of them may alternatively be used for the purpose of the present invention. Still alternatively, any of Group II-VI semiconductors such as ZnSe/CdSe/ZnS and a mixed crystal of any of them may be used for the purpose of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-054114, filed on Feb. 28, 2006, which is hereby incorporated by reference herein in entirety.

What is claimed is:

1. A vertical cavity surface emitting laser comprising: a cavity constituted by a pair of reflectors on a substrate; and an active region interposed in the cavity, wherein at least one of the reflectors constituting the cavity includes a first photonic crystal layer, a second photonic crystal layer formed on the first photonic crystal layer, and a third photonic crystal layer formed on the second photonic crystal layer, wherein the first, second, and third photonic crystal layers include a first medium and a second medium so as to have a refractive index changing periodically in in-plane directions of the substrate, wherein the first medium is arranged in the first, second, and third photonic crystal layers such that the first medium has a diameter that is larger in the second photonic crystal layer than in the first photonic crystal layer, and that is larger in the third photonic crystal layer than in the second photonic crystal layer, wherein, in each of the first, second, and third photonic crystal layers, light resonates in an in-plane direction and exits in a perpendicular direction, and wherein the first, second, and third photonic crystal layer contains no defect, wherein the first photonic crystal layer and the second photonic crystal layer are different from each other in composition, wherein the second photonic crystal layer and the third photonic crystal layer are different from each other in composition and wherein light exits in an output direction and wherein the third photonic layer is farther from the substrate in the output direction than the first photonic layer and the second photonic layer.

2. The vertical cavity surface emitting laser according to claim 1, wherein the diameter of the first medium changes continuously or quasi-continuously in the direction of the thickness of the first medium.

3. The vertical cavity surface emitting laser according to claim 2, wherein one of the mediums of the at least one of the reflectors includes holes.

4. The vertical cavity surface emitting laser according to claim 3, wherein the first, second, and third photonic crystal layers are each provided with a plurality of holes, and wherein a hole diameter of the plurality of holes of each of the layers changes continuously or quasi-continuously in a direction perpendicular to surfaces of the reflectors.

5. The vertical cavity surface emitting laser according to claim 2, wherein
one of the mediums of the at least one of the reflectors is a multilayer film made of films having mutually different compositions; and
a refractive index of each of the films of the multilayer film changes continuously or quasi-continuously in a direction perpendicular to surfaces of the pair of reflectors.

6. The vertical cavity surface emitting laser according to claim 1, wherein the reflectors do not extend into the active region.

7. A vertical cavity surface emitting laser comprising: a multilayer film reflector, a first clad layer, an active layer, a second clad layer, and a second reflector in this order on a substrate, wherein the multilayer film reflector includes a first photonic crystal layer, a second photonic crystal layer formed on the first photonic crystal layer, and a third photonic crystal layer formed on the second photonic crystal layer, the first, second, and third photonic crystal layers each include a first medium and a second medium so as to have a refractive index changing periodically in in-plane directions of the substrate, the first medium is arranged in the first, second, and third photonic crystal layers such that the first medium has a diameter that is larger in the second photonic crystal layer than in the first photonic crystal layer, and that is larger in the third photonic crystal layer than in the second photonic crystal, the diameter in each of the photonic crystal layers being gradually diminishing as the distance to the second clad layer decreases, in each of the first, second, and third photonic crystal layers, light resonates in an in-plane direction and exits in a perpendicular direction, wherein the first, second, and third photonic crystal layers each contain no defect, wherein the first photonic crystal layer and the second photonic crystal layer are different from each other in composition, wherein the second photonic crystal layer and the third photonic crystal are different from each and wherein light exits in an output direction and wherein the third photonic layer is farther from the substrate in the output direction than the first photonic layer and the second photonic layer.

* * * * *